United States Patent
Forbes

(10) Patent No.: US 6,646,474 B2
(45) Date of Patent: *Nov. 11, 2003

(54) CLOCKED PASS TRANSISTOR AND COMPLEMENTARY PASS TRANSISTOR LOGIC CIRCUITS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/218,511

(22) Filed: Aug. 15, 2002

(65) Prior Publication Data

US 2002/0191460 A1 Dec. 19, 2002

Related U.S. Application Data

(63) Continuation of application No. 09/878,432, filed on Jun. 12, 2001, now Pat. No. 6,462,582.

(51) Int. Cl.[7] .............................................. H03K 19/01

(52) U.S. Cl. .......................... 326/98; 326/95; 326/113; 326/17; 327/208; 327/214; 327/224

(58) Field of Search ............................ 326/93, 95, 96, 326/98; 327/208–212, 214, 215, 224, 225

(56) References Cited

U.S. PATENT DOCUMENTS

| | | | |
|---|---|---|---|
| 5,612,638 A | | 3/1997 | Lev |
| 5,831,451 A | | 11/1998 | Bosshart |
| 5,841,300 A | | 11/1998 | Murabayashi et al. |
| 6,046,606 A | * | 4/2000 | Chu et al. ............... 326/95 |
| 6,060,910 A | | 5/2000 | Inui |

OTHER PUBLICATIONS

L.A. Glasser and D.W. Dobberpuhl, "The Design and Analysis of VLSI Circuits," Addison–Wesley, Reading Massachusetts, 1985, pp. 16–20L.*

J.M. Rabaey, "Digital Integrated Circuits; A design perspective," Prentice Hall, Upper Saddle River, N.J., pp. 210–222, 1996.*

K. Bernstein et al., "High Speed Design Styles Leverage IBM Technology Prowess," MicroNews, vol. 4, No. 3, 1998*.

T. Fuse, et al., "A 0.5V 200mhz 1–stage 32b ALU Using Bias Controlled SOI Pass–Gate Logic," Dig. IEE Int. Solid–State Circuits Conf., San Francisco, pp. 286–287, 1997.*

K. Yano et al., "Top–Down Pass–Transistor Logic Design," IEEE J. Solid–State Circuits, vol. 31, No. 6, pp. 792–803, Jun. 1996.*

K.H. Cheng et al., "A 1.2V CMOS Multiplier Using Low–Power Current Sensing Complementary Pass–Transistor Logic," Proc. Third Int. Conf. On Electronics, Circuits and Systems, Rodos, Greece, Oct. 13–16, vol. 2, pp. 1037–40, 1996.*

(List continued on next page.)

Primary Examiner—Michael Tokar
Assistant Examiner—Vibol Tan
(74) Attorney, Agent, or Firm—Dickstein Shapiro Morin & Oshinsky LLP

(57) ABSTRACT

A logic circuit and associated method are provided to improve the switching performance of integrated circuit devices. The logic circuit includes a pass transistor logic circuit, a CMOS transistor pair connected as an inverter and having an input coupled to the output of the pass transistor logic circuit, a clocking transistor coupled between the inverter and a potential terminal to selectively enable the inverter according to a first clocking signal, and a precharge transistor coupled between the inverter output and a potential terminal to precharge the inverter output low according to a second clocking signal.

17 Claims, 8 Drawing Sheets

OTHER PUBLICATIONS

S.I. Kayed et al., "CMOS Differential Pass–Transistor Logic (CMOS DPTL) Predischarge Buffer Design," 13$^{th}$ National Radio Science Conf., Cairo, Egypt, pp. 527–34, 1996.*

V.G. Oklobdija, "Differential and Pass–Transistor CMOS Logic for High Performance Systems," Microelectronic J., vol. 29, No. 10, pp. 679–688, 1998.*

S. Yamashita et al., "Pass–Transistor?CMOS Collaborated Logic: The Best of Both Worlds," Dig. Symp. On VLSI Circuits, Kyoto, Japan, Jun. 12–14, pp. 31–32, 1997.*

R. Zimmerman et al., "Low–Power Logic Styles: CMOS Versus Pass Transistor Logic," IEE J. Solid–State Circuits, vol. 32, No. 7, pp. 1079–1790, Jul. 1997.*

C. Tretz et al., "Performance Comparison of Differential Statis CMOS Circuit Topologies in SOI Technology," Proc. IEE Int. SOI Conference, Oct. 5–8, Fl, pp. 123–4, 1998.*

L. McMurchie, S. Kio, G. Yee, T. Thorp, and C. Sechen, "Output Prediction Logic Techniques," Symp. On VLSI Circuits, Hawaii, Jun. 2000. (to be published)*.

* cited by examiner

CLOCKED PASS TRANSISTOR AND COMPLEMENTARY PASS TRANSISTOR LOGIC CIRCUITS

This is a continuation of Application No. 09/878,432, filed Jun. 12, 2001, now U.S. Pat. No. 6,462,582.

FIELD OF THE INVENTION

The present invention relates to improving the switching performance of an integrated circuit, and more particularly to a logic circuit employing clocked pass transistor and complementary pass transistor logic.

BACKGROUND OF THE INVENTION

Pass transistor logic is one of the oldest logic techniques used in forming integrated circuits. Prior to the advent of complementary metal-oxide semiconductor (CMOS) technology currently popular in integrated circuit fabrication, pass transistor logic had been used in n-channel metal-oxide semiconductor (NMOS) circuits. Pass transistor logic was subsequently implemented in CMOS technology circuits. For example, CMOS pass transistor logic has been applied in microprocessors and other circuits. Comparisons have been made between pass transistor logic and standard CMOS logic for a variety of different applications and power supply voltages.

Static pass transistor logic circuits of the type shown in FIGS. 1–2 have been used in CMOS technology and integrated circuits, for example, in the design of microprocessors and other structures. However, static pass transistor logic circuits suffer from a common problem: there is a threshold voltage drop at the input across a pass transistor. As illustrated in FIG. 1, if the input voltage source 28 is VDD at a logical "1" or high logic state, then the voltage at a node 34 (the input to the inverter 22) will rise only to VDD-VTN, where VTN is the threshold voltage of the transistor 26. In addition, the rise time required for the node 34 to reach this voltage (VDD-VTN) is theoretically infinite, since the NMOS pass transistor 26 has a final state which theoretically has infinite resistance.

This problem is exacerbated if, as shown in FIG. 2, the output of one pass transistor 32 is used to drive the gate of another transistor 26. In the circuit shown in FIG. 2, the voltage at node 34 (the input to the inverter 22) will charge only to VDD-2VTN. This result is unacceptable in low power supply circuits and therefore design rules preclude such a configuration.

Various techniques have been used to overcome these problems. One technique is the use of level restore circuits, examples of which are illustrated in FIGS. 3–4. Referring to FIG. 3, a level restore circuit 30 is illustrated, including a pass transistor 26 and level restore transistor 38, in which the output of the inverter 22 is fed back to control a PMOS level restore transistor 38. If the input to the inverter 22 at the node 34 is switching high, then the output of the inverter 22 is switching low, thus driving the gate of the PMOS level restore transistor 38 to pull up the input to the inverter 22 at the node 34. This is a positive feedback circuit which tends to latch the input high regardless of how slowly the original input signal was rising. In this manner, the level restore circuit 30 overcomes the threshold voltage drop at the input to the inverter 22. The level restore circuit 40 shown in FIG. 4 is essentially equivalent to the level restore circuit 30 of FIG. 3, except that an additional inverter 44 is used to drive the gate of the PMOS level restore transistor 42 to pull up the input to the inverter 22 at the node 34.

Another problem plaguing pass transistor logic circuits is signal propagation delay. For a plurality of pass transistor stages connected in series, each stage including a pass transistor circuit and an inverter, when the logic state of the first pass transistor circuit changes state, a chain reaction ensues in which every output changes state in sequence. For example, FIG. 9 illustrates a plurality of pass transistor circuits 26 and inverters 22 connected in series. The noted chain reaction causes a long signal delay through the chain, wasting energy and causing high power dissipation. Concerns about propagation delay of pass transistor logic spurred the development of prediction logic circuits attached to each inverter in the chain. However, incorrect predictions may lead to the combination of an input and an output of an inverter at a same logic state, which is not a stationary or stable condition for such a circuit.

Accordingly, there is a strong desire and need to improve the switching performance of integrated circuits using logic that overcomes the voltage drop and propagation delay problems of pass transistor logic.

SUMMARY OF THE INVENTION

A logic circuit and associated method are provided to improve the switching performance of integrated circuit devices. Clocked pass transistor logic is combined with precharge circuitry, and the output nodes of clocked inverters receiving the output of the pass transistor circuits are precharged low. The precharging reduces signal propagation delays and can significantly increase the performance of switching in integrated circuits employing pass transistors.

The logic circuit includes a pass transistor logic circuit; a clocked inverter circuit including a CMOS transistor pair having a gate of a first transistor coupled to a gate of a second transistor, the coupled gates being coupled to an output of the pass transistor logic circuit, and a first source/drain region of the first transistor coupled to a first source/drain region of the second transistor, the coupled first source/drain regions being coupled to an output of the clocked inverter circuit, wherein a second source/drain region of the first transistor is coupled to a first potential terminal. The logic circuit further includes a clocking transistor coupled between the second transistor and a second potential terminal and having a gate coupled to a first clocking signal and a precharge transistor coupled between the clocked inverter output and the second potential terminal and having a gate coupled to a second clocking signal.

In another aspect of the invention, switching performance is improved by allowing only low to high transitions at the output of the clocked inverter circuit. The output of the clocked inverter circuit is precharged low. If the output of the pass transistor logic connected to the input of the clocked inverter is attempting to switch high and thus the output of the inverter is attempting to switch low, then the output of the clocked inverter will simply remain low at the precharged state. If the output of the pass transistor logic is attempting to switch low and thus the output of the inverter is attempting to switch high, then the output of the clocked inverter will transition from the low precharge to a high state quickly through low resistance PMOS transistors in the clocked inverter circuit.

In another aspect of the invention, a clocking transistor and a precharge transistor are used to assist in precharging the output of the inverter circuit while avoiding unstable circuit conditions. The clocked inverter circuit includes one or more clocking transistors which couple the inverter circuit to ground only during periods in which the inverter output is not being precharged. The gate of the clocking transistor is controlled by a first clocking signal, and the gate of the precharge transistor is controlled by a second clocking signal, each of the first and second clocking signals having a first state (e.g., low) during a precharge phase and then transitioning to a second state (e.g., high) during an inverter operation phase. The first and second clocking signals are complementary signals so that during the precharge phase, the precharge transistor is gated (e.g., high state) while the clocking transistor is not gated (e.g., low state), and therefore the output of the inverter circuit is precharged low and the inverter is not enabled. During a subsequent operation phase, precharging ceases, the inverter is enabled and the output of the pass transistor circuit controls the output of the inverter circuit. The output of the inverter circuit is evaluated during the operation phase.

BRIEF DESCRIPTION OF THE DRAWINGS

The foregoing and other features and advantages of the invention will become more apparent from the detailed description of the exemplary embodiments of the invention given below with reference to the accompanying drawings in which.

DETAILED DESCRIPTION OF THE INVENTION

The invention provides a logic circuit and associated method which may be used in forming integrated circuit devices. While the invention is described below with reference to a memory system, including memory devices as representative integrated circuit devices which may include the logic circuit of the present invention, it should be understood that the invention may be used with any type of system which uses logic circuits.

In addition, while the invention is described below with reference to simple control logic circuits, including simple pass transistor circuits which may used with the logic circuit of the present invention, it should be understood that simple pass transistor circuits are not required and the invention may be used with any type of control logic circuitry, for example complementary pass transistor circuitry.

Figure 1:
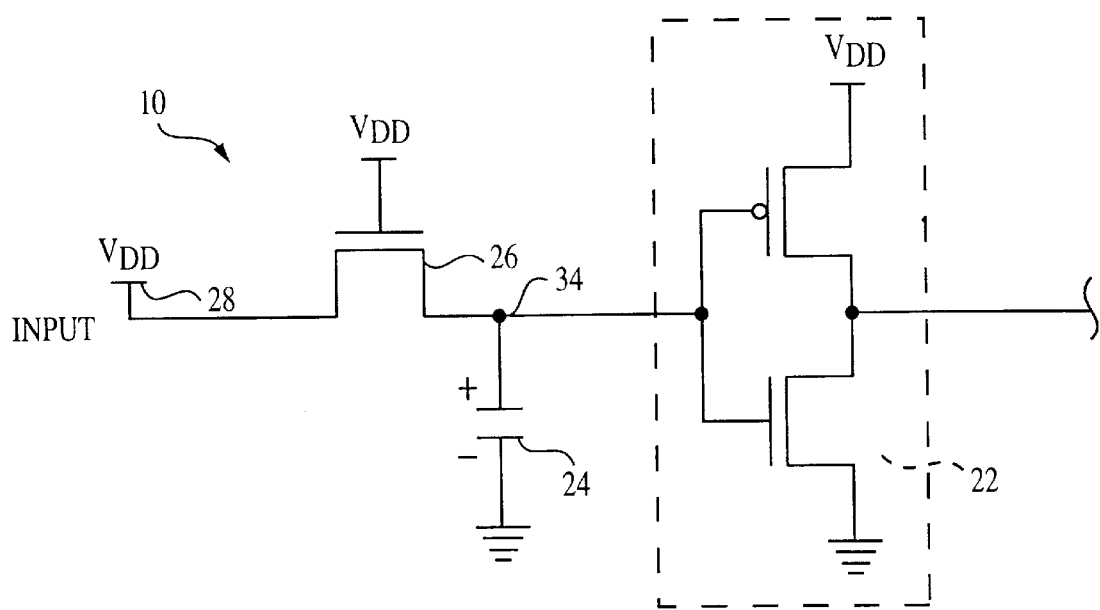
FIG. 1 illustrates a known static pass transistor logic circuit.
Figure 2:
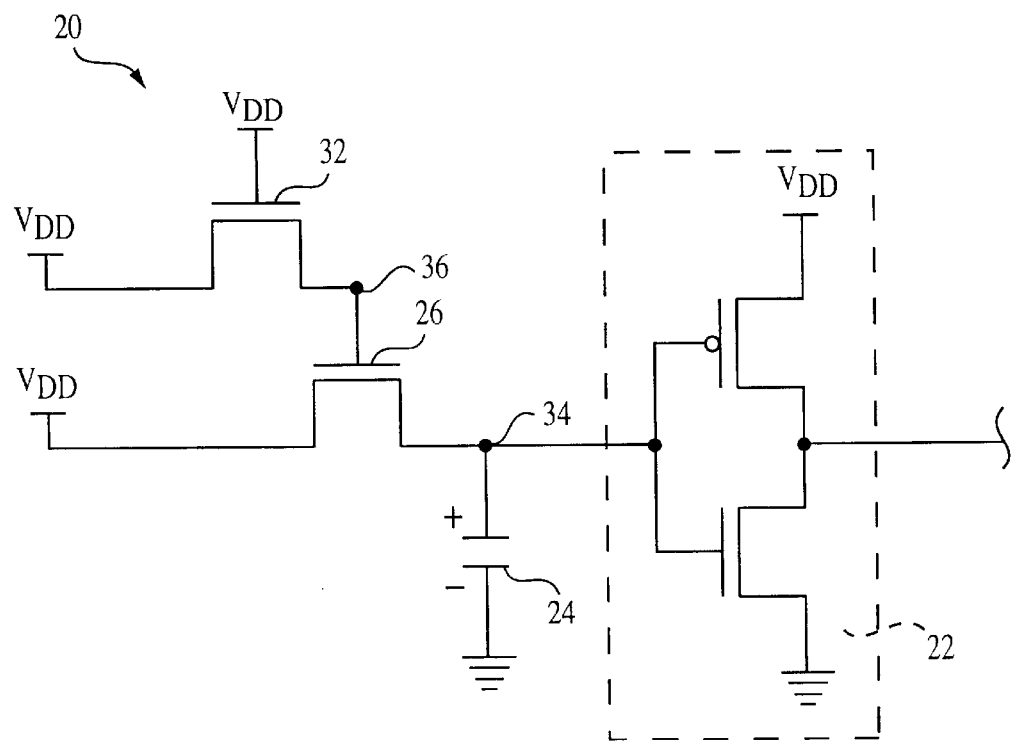
FIG. 2 illustrates another known static pass transistor logic circuit.
Figure 3:
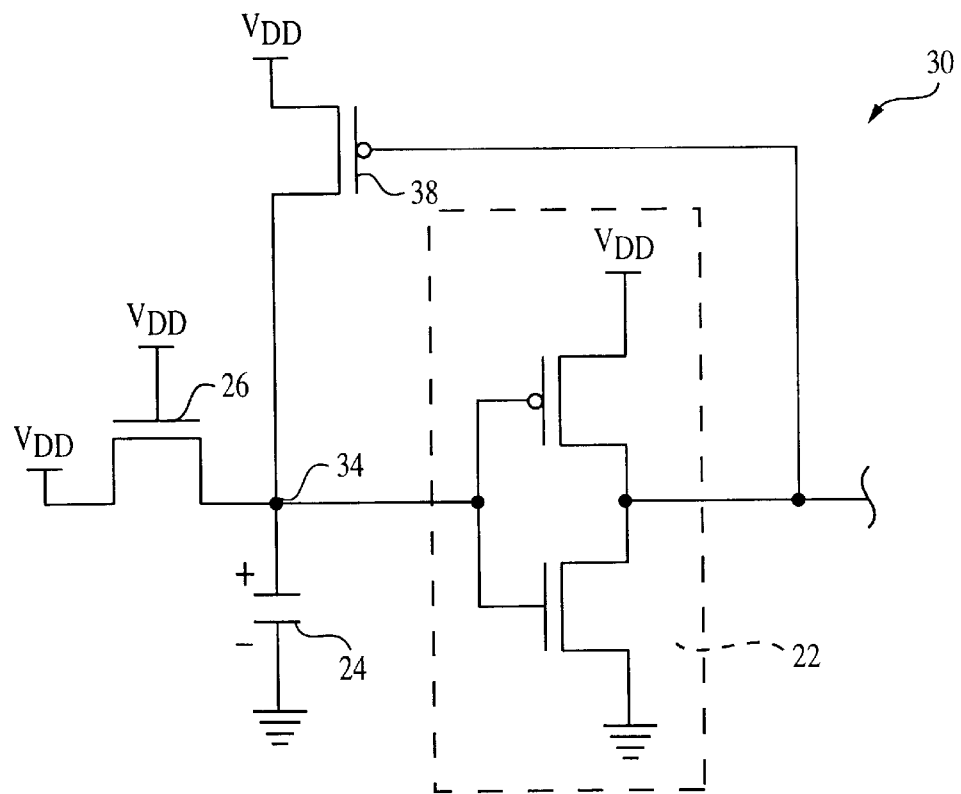
FIG. 3 illustrates a known pass transistor logic circuit having level restore circuitry.
Figure 4:
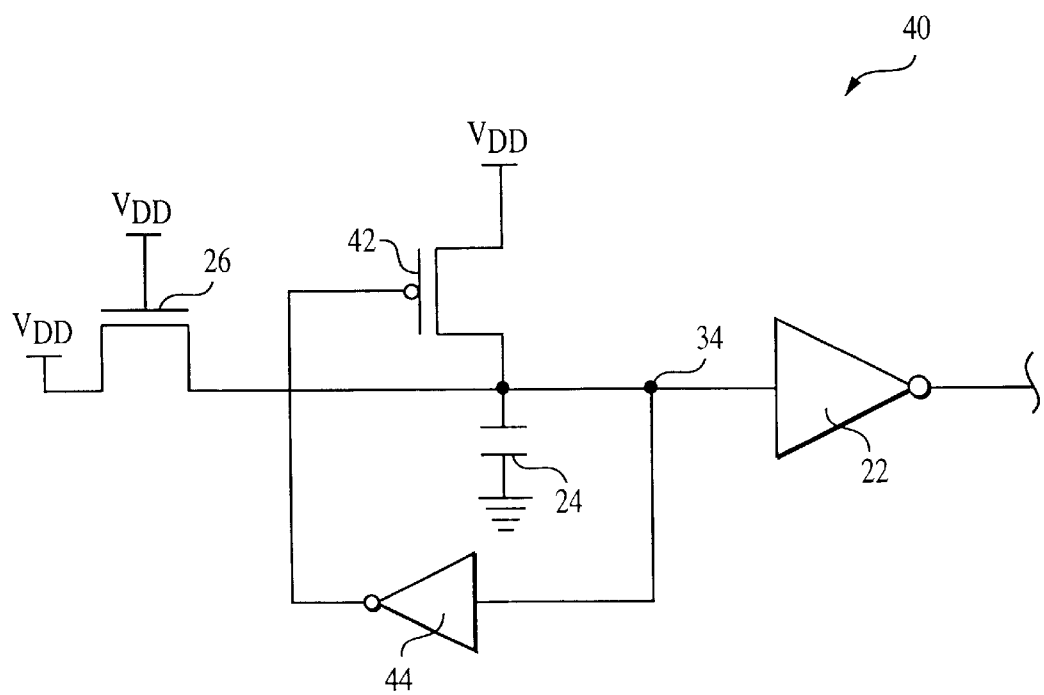
FIG. 4 illustrates another known pass transistor logic circuit having level restore circuitry.
Figure 5:
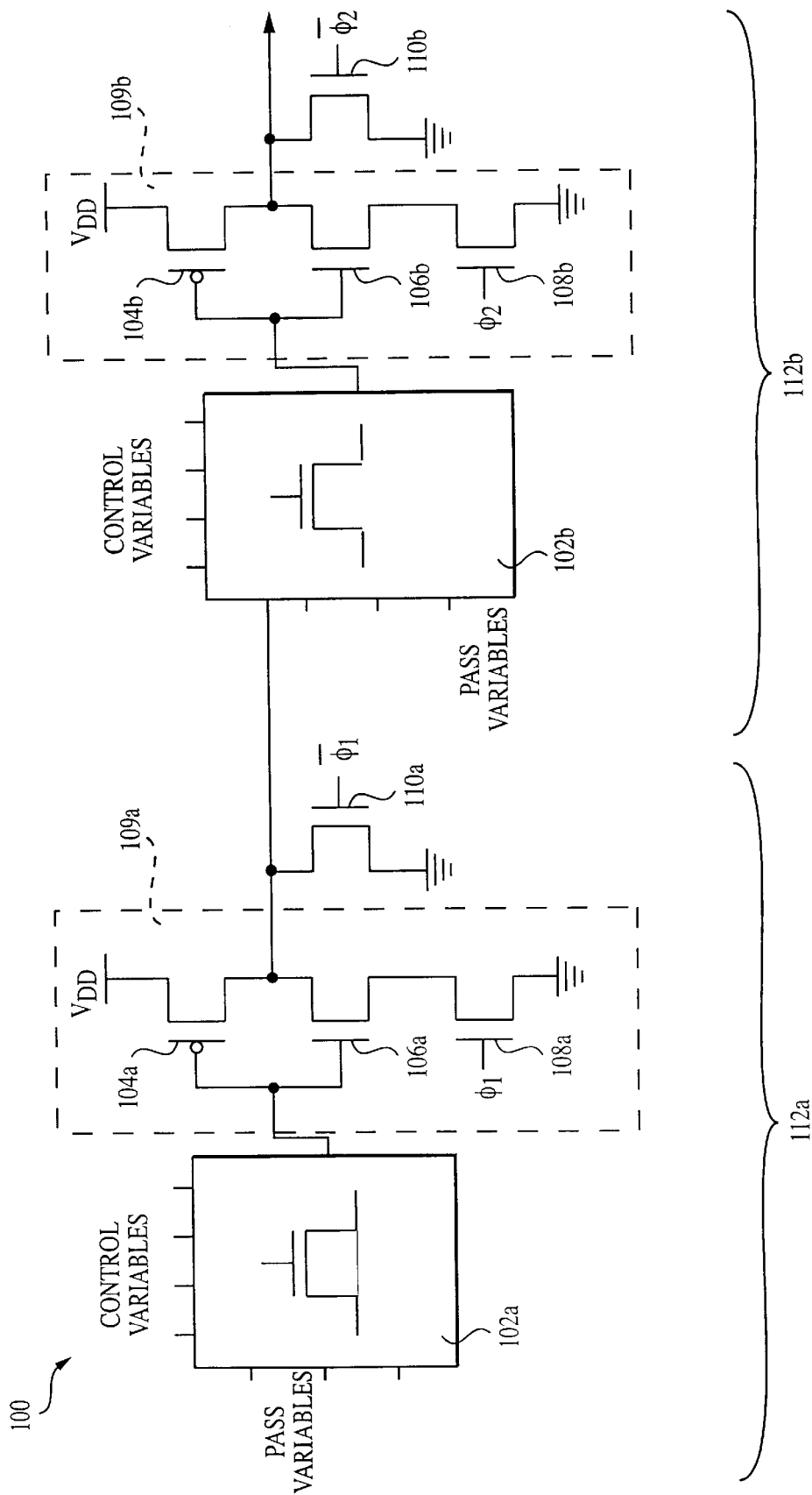
FIG. 5 illustrates a logic circuit in accordance with an exemplary embodiment of the invention.
Figure 7:
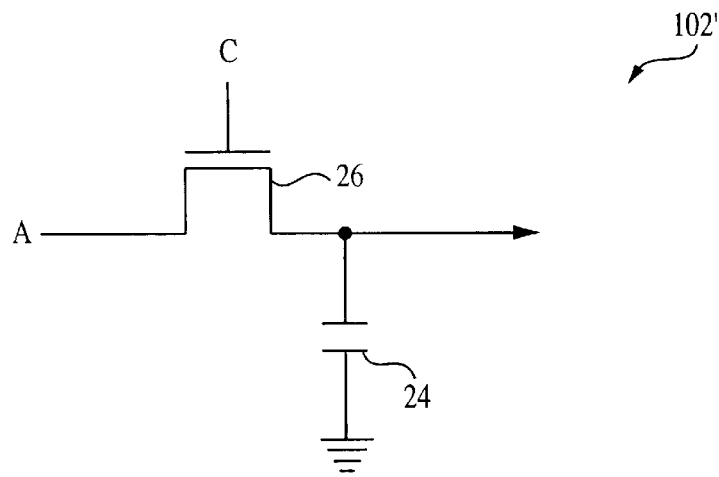
FIG. 7 illustrates a simple pass transistor logic circuit that may be used in accordance with an exemplary embodiment of the invention.
Figure 8:
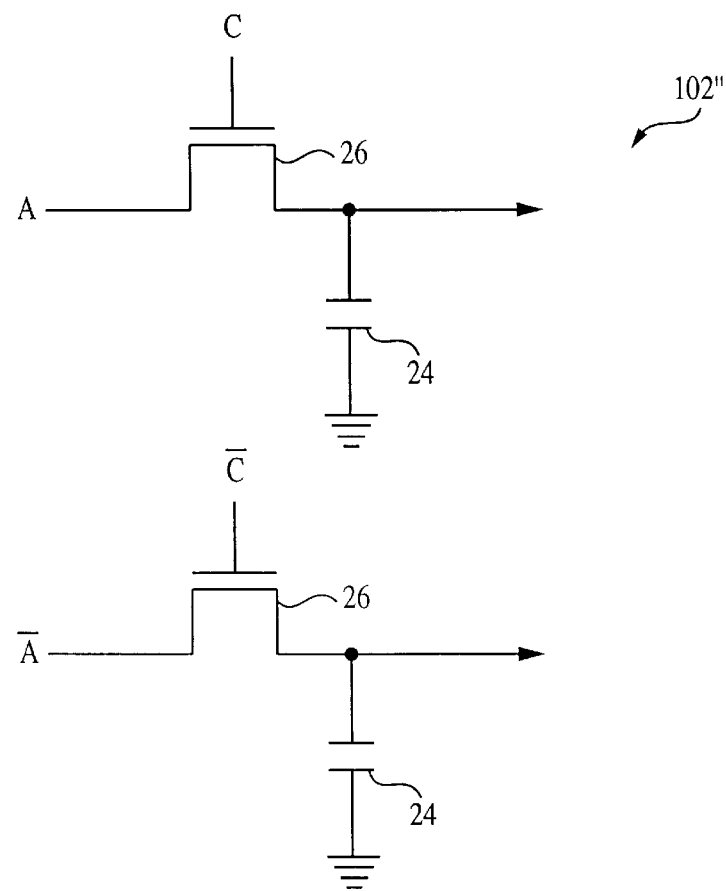
FIG. 8 illustrates a complementary pass transistor logic circuit that may be used in accordance with another exemplary embodiment of the invention.
Figure 9:
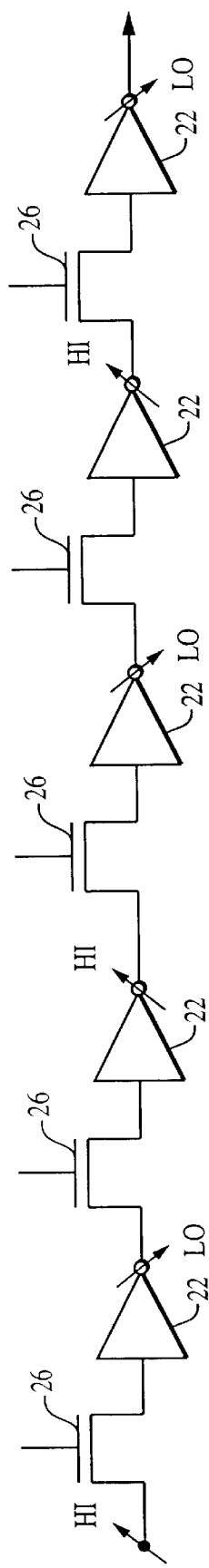
FIG. 9 illustrates a plurality of conventional logic circuits connected in a chain.
Figure 10:
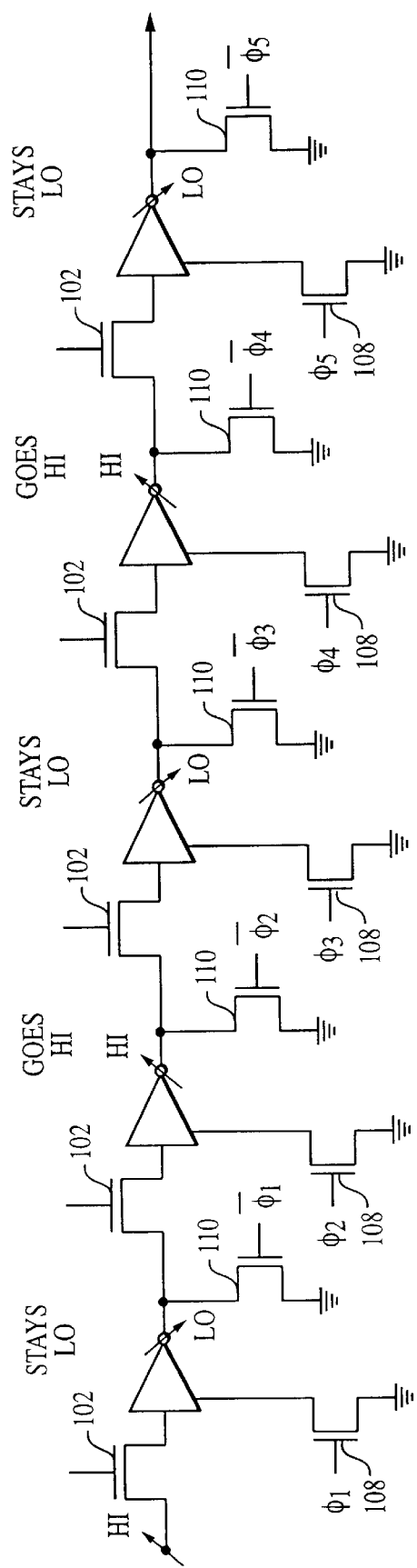
FIG. 10 illustrates a plurality of logic circuits connected in a chain in accordance with another exemplary embodiment of the invention.

Referring to FIG. 5, an exemplary logic circuit 100 in accordance with the present invention is illustrated. The logic circuit 100 illustrated in FIG. 5 includes two stages 112a and 112b, each stage (e.g., 112a) including a precharge circuit which includes a precharge transistor 110a, a clocked inverter circuit 109a, and a control logic circuit formed as a pass transistor circuit 102a. Each of the pass transistor circuits 102a, 102b may, for example, be a simple pass transistor circuit 102' as illustrated in FIG. 7, or a pair 102" of complementary pass transistor circuits having complementary inputs and outputs as shown in FIG. 8, or other pass transistor circuit arrangement. For the exemplary complementary pass transistor circuit 102" of FIG. 8, each complementary output may be connected to a separate clocked inverter circuit 109. The pass transistor circuit 102 in FIGS. 5 and 10 is illustrated as a simple pass transistor circuit (e.g., simple pass transistor circuit 102' in FIG. 7) for simplicity.

Each clocked inverter circuit, e.g., clocked inverter circuit 109a, includes a CMOS transistor pair, including PMOS transistor 104a and NMOS transistor 106a, with gates coupled together and connected to the output of the pass transistor circuit 102a. One source/drain region of each transistor 104a, 106a is coupled together and connected to the output of the clocked inverter circuit 109a. The clocked inverter circuit 109a also includes a clocking transistor 108a coupled between the transistor 106a and a second potential terminal (e.g., ground). The gate of the clocking transistor 108a is controlled by a first clocking signal $\phi_1$.

The precharge circuit includes a precharge transistor 110a coupled between a second potential terminal (e.g., ground) and the output of the clocked inverter circuit 109a. The gate of the precharge transistor 110a is controlled by a second clocking signal (e.g., $\overline{\phi}_1$). The first and second clocking signals may be complementary signals such that when the first clocking signal (e.g., $\phi_1$) is high, the second clocking signal (e.g., $\overline{\phi}_1$) is low, for example as illustrated in FIG. 6.

Figure 6:
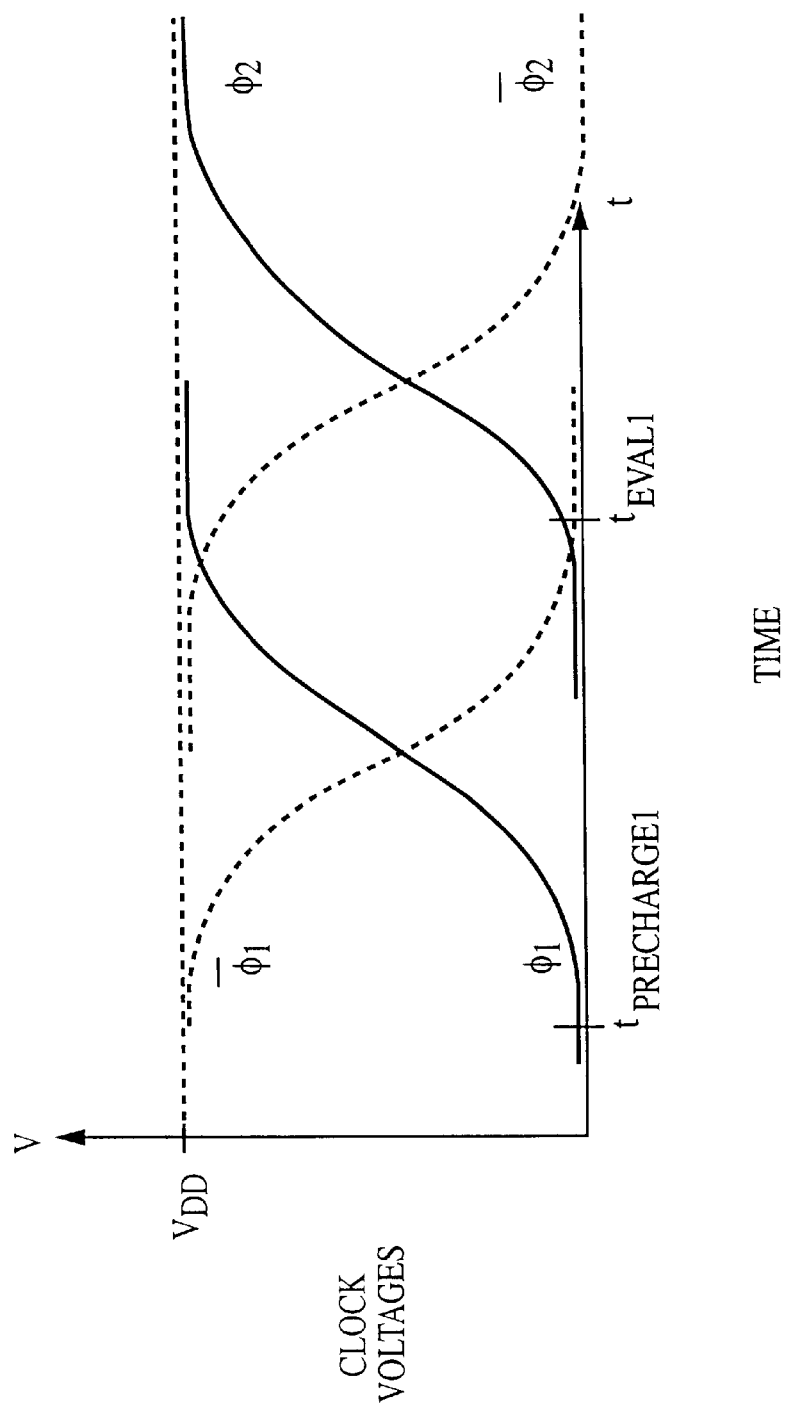
FIG. 6 illustrates a timing diagram for clocking signals in accordance with the exemplary embodiment shown in FIG. 5.

Referring to FIG. 6, a timing diagram is shown illustrating the clocking signals $\phi_1$, $\overline{\phi}_1$, $\phi_2$, $\overline{\phi}_2$ that may be applied to the gates of the clocking 108a, 108b and precharge 110a, 110b transistors of the logic circuit 100 illustrated in FIG. 5. Note that different clocks are used within the same stage (e.g., $\phi_1$ and $\overline{\phi}_1$ are used in a first stage 112a, and $\phi_2$ and $\overline{\phi}_2$ are used in a second stage 112b). Also note that the clocking signals are time-delayed from one stage 112a until the next stage 112b (e.g., $\phi_2$ appears after $\phi_1$). At a first time, e.g., $t_{PRECHARGE1}$, the output of the clocked inverter 109a of the first stage 112a is precharged low via gating of the first stage's precharge transistor 110a, while the first stage's clocking transistor 108a is not gated. At a second time, e.g., $t_{EVAL1}$, the CMOS transistor pair 104a, 106a of the first stage 112a evaluates the input via gating of the clocking transistor 108a, while the precharge transistor 110a is not gated. The second stage 112b may be precharged and evaluated in a similar fashion, except that the second stage signals ($\phi_2$ and $\overline{\phi}_2$) are delayed relative to the first stage signals ($\phi_1$ and $\overline{\phi}_1$), as shown in FIG. 6. In this way, each succeeding stage waits until the preceding stage's output is valid before evaluating its logic decision, thereby avoiding unstable circuit conditions.

In operation, a plurality of stages of the type illustrated in FIG. 5 may be connected in series, as shown in FIG. 10. As noted, each stage includes a control logic circuit (e.g., a pass transistor circuit 102), an inverter circuit (e.g., a clocked inverter including a clocking transistor 108), and a precharge circuit (e.g., a precharge transistor 110).

In each stage shown in FIG. 10, a clocking transistor 108 and a precharge transistor 110 are used to assist in precharging the output of an inverter circuit while avoiding unstable circuit conditions. Each clocked inverter circuit 109 (FIG. 5) may include one or more clocking transistors (e.g., clocking transistor 108) which avoid unstable circuit conditions by coupling the inverter circuit to ground only during periods in which the inverter output is not being precharged. The gate of each clocking transistor 108 is controlled by a first clocking signal (e.g., $\phi_1$), and the gate of each precharge transistor 110 is controlled by a second clocking signal (e.g., $\overline{\phi}_1$). The first and second clocking signals may be complementary signals so that during the precharge phase, the precharge transistor 110 is gated (e.g., high state) while the clocking transistor 108 is not gated (e.g., low state), and therefore the output of the inverter circuit is precharged low and the inverter is not enabled. During a subsequent operation phase, precharging ceases, the inverter is enabled and the output of the pass transistor circuit 102 controls the output of the inverter circuit. The output of the inverter circuit is evaluated during the operation phase.

The logic circuit 100 improves switching performance by permitting fast low to high transitions at the output of each clocked inverter circuit 109. As noted, the outputs of the clocked inverters 109 are precharged low. If an output of a clocked inverter 109 is attempting to switch low, then the output will simply remain low at the precharged state. If an output of the clocked inverter 109 is attempting to switch high, then it may do so quickly through low resistance PMOS transistors, for example PMOS transistor 104, in the clocked inverter circuit 109. The PMOS transistor 104 may be made large to speed up the switching time from low to high.

Figure 11:
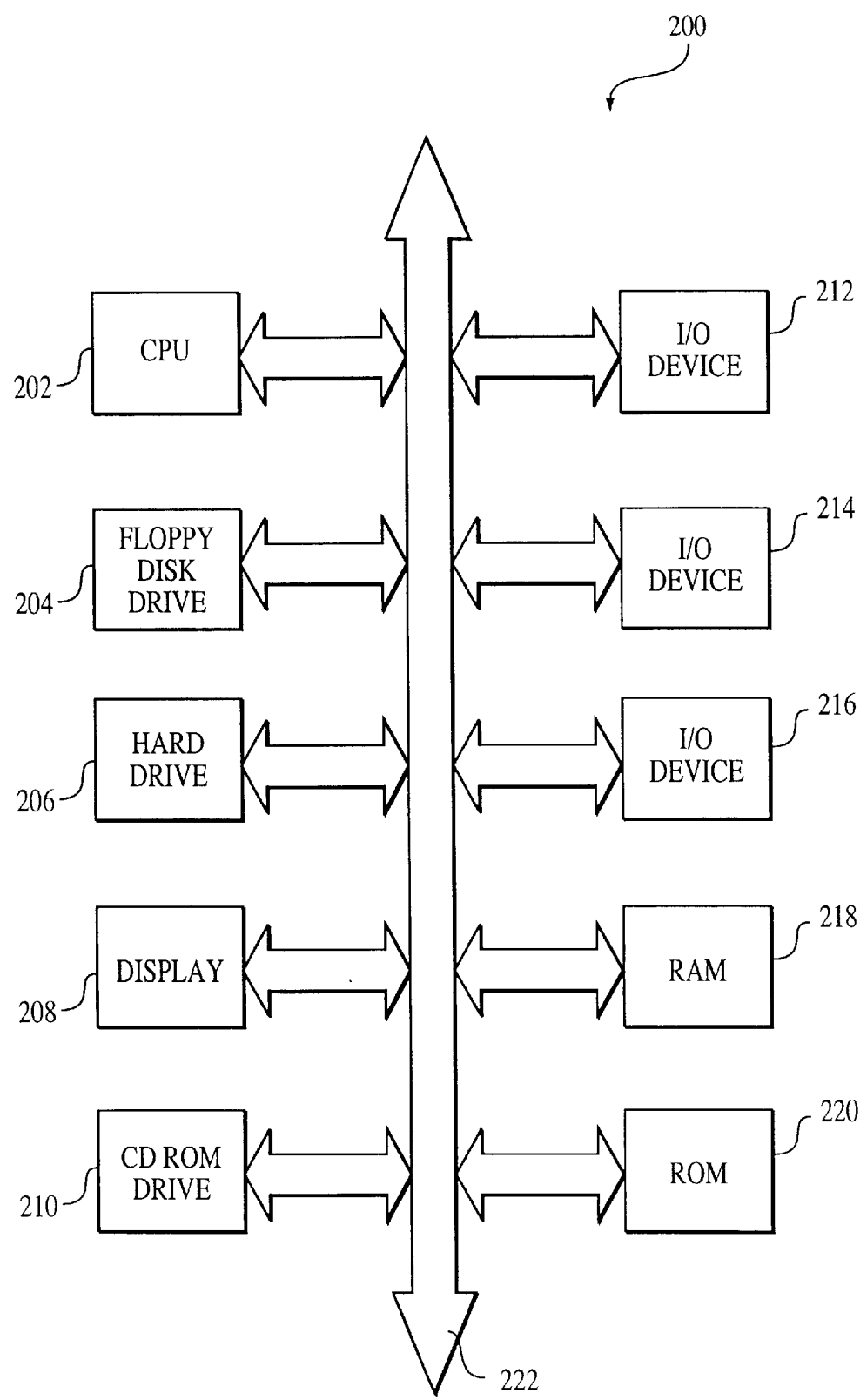
FIG. 11 illustrates a processor system formed in accordance with another exemplary embodiment of the invention.

FIG. 11 illustrates an exemplary processor system 200 which may include a logic circuit 100. Referring to FIG. 11, the processor system 200, which may be a computer system, for example, generally comprises a central processing unit (CPU) 202, for example, a microprocessor, that communicates with one or more input/output (I/O) devices 212, 214, 216 over a system bus 222. The computer system 200 also includes random access memory (RAM) 218, a read only memory (ROM) 220 and, in the case of a computer system may include peripheral devices such as a floppy disk drive 204, a hard drive 206, a display 208 and a compact disk (CD) ROM drive 210 which also communicate with the processor 202 over the bus 222. The RAM 218 includes memory devices having at least one logic circuit 100 constructed in accordance with the invention. In addition, one or more of the other elements shown in FIG. 11 may also include at least one logic circuit 100 constructed in accordance with the invention. It should also be noted that FIG. 11 is merely representative of many different types of processor system architectures which may employ the invention.

The logic circuit 100 has been described that improves switching performance by overcoming the voltage drop and propagation delays problems of the prior art. These and other advantages are achieved by precharging the output of the inverters low and time-delaying the clocking of sequential stages, so that unstable circuit conditions are avoided during a precharge phase, and only fast low to high transitions occur during an operational phase of the logic circuit 100.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A memory system, comprising:
   at least one memory device for storing data,
   said memory device having at least one control logic circuit;
   at least one inverter including a CMOS transistor pair having a gate of a first transistor coupled to a gate of a second transistor, said coupled gates being coupled to an output of said at least one control logic circuit, and a first source/drain region of said first transistor coupled to a first source/drain region of said second transistor, said coupled first source/drain regions being coupled to an output of said inverter, wherein a second source/drain region of said first transistor is coupled to a first potential terminal;
   at least one precharge transistor coupled to said inverter and configured to precharge said output of said inverter to a first logic state; and
   at least one clocking transistor coupled to said inverter and configured to selectively enable said output of said inverter.

2. The memory system as in claim 1, wherein said at least one clocking transistor has a gate coupled to a first clocking signal and said at least one precharge transistor has a gate coupled to a second clocking signal.

3. The memory system as in claim 2, wherein said first and second clocking signals are complementary signals.

4. A memory system, comprising:
   at least one memory device for storing data,
   said memory device having at least one control logic circuit;
   at least one inverter including a CMOS transistor pair having a gate of a first transistor coupled to a gate of a second transistor, said coupled gates being coupled to an output of said at least one control logic circuit, and a first source/drain region of said first transistor coupled to a first source/drain region of said second transistor, said coupled first source/drain regions being coupled to an output of said inverter, wherein a second source/drain region of said first transistor is coupled to a first potential terminal;
   at least one clocking transistor having a gate coupled to a first clocking signal, a first source/drain region coupled to a second potential terminal, and a second source/drain region coupled to a second source/drain region of said second transistor; and
   at least one precharge transistor having a gate coupled to a second clocking signal, a first source/drain region coupled to said second potential terminal, and a second source/drain region coupled to said output of said inverter.

5. The memory system as in claim 4, wherein during a first phase, said precharge transistor is configured to couple said output of said inverter to said second potential terminal.

6. The memory system as in claim 4, wherein during a second phase, said clocking transistor is configured to couple said second source/drain region of said second transistor to said second potential terminal.

7. The memory system as in claim 4, wherein said first clocking signal is initially ma low state and said second clocking signal is initially in a high state, permitting said precharge transistor to precharge said inverter output to a low state.

8. The memory system as in claim 4, wherein when said first clocking signal transitions from said initial low state to a high state and said second clocking signal transitions from said initial high state to a low state, said inverter output is set according to said output of said control logic circuit.

9. The memory system as in claim 4, wherein when said output of said control logic circuit initially attempts to place said inverter output in a low state, then said inverter output continues said low state of said precharge.

10. The memory system as in claim 4, wherein when said output of said control logic circuit initially attempts to place said inverter output in a high state, then said inverter output transitions from said low state of said precharge to said high state.

11. The memory system as in claim 4, wherein said at least one control logic circuit comprises a pass transistor control circuit.

12. The memory system as in claim 4, wherein said pass transistor control circuit comprises a pass transistor circuit.

13. The memory system as in claim 4, wherein said pass transistor control circuit comprises a pair of complementary pass transistor circuits.

14. The memory system as in claim 4, wherein said second potential terminal is at ground potential.

15. The memory system as in claim 4, wherein said clocking transistor is an NMOS transistor.

16. The memory system as in claim 4, wherein said precharge transistor is an NMOS transistor.

17. The memory system as in claim 4, wherein said first and second clocking signals are complementary signals.

* * * * *

UNITED STATES PATENT AND TRADEMARK OFFICE
CERTIFICATE OF CORRECTION

PATENT NO. : 6,646,474 B2
DATED : November 11, 2003
INVENTOR(S) : Leonard Forbes It is certified that error appears in the above-identified patent and that said Letters Patent is hereby corrected as shown below:

Column 6,
Line 67, reads "ma", should read -- in a --;

Column 8,
Lines 4 and 6, reads "4", should read -- 11 --.

Signed and Sealed this

Twenty-third Day of March, 2004

JON W. DUDAS
*Acting Director of the United States Patent and Trademark Office*